United States Patent
Daley et al.

(10) Patent No.: US 9,058,460 B2
(45) Date of Patent: Jun. 16, 2015

(54) THERMALLY-OPTIMIZED METAL FILL FOR STACKED CHIP SYSTEMS

(71) Applicant: International Business Machines Corporation, Armonk, NY (US)

(72) Inventors: Douglas M. Daley, Essex Junction, VT (US); Wolfgang Sauter, Hinesburg, VT (US); Hung H. Tran, East Fishkill, NY (US); Wayne H. Woods, Burlington, VT (US); Ze Zhang, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/782,561

(22) Filed: Mar. 1, 2013

(65) Prior Publication Data
US 2014/0246757 A1   Sep. 4, 2014

(51) Int. Cl.
G06F 17/50   (2006.01)
H01L 23/367   (2006.01)
H01L 23/48   (2006.01)
H01L 23/522   (2006.01)

(52) U.S. Cl.
CPC ........ G06F 17/5077 (2013.01); H01L 23/3677 (2013.01); H01L 23/481 (2013.01); H01L 23/522 (2013.01); H01L 2224/13 (2013.01); H01L 2924/1461 (2013.01)

(58) Field of Classification Search
CPC ................................ G06F 17/50; G06F 15/04
USPC .................................................. 716/126, 139
See application file for complete search history.

(56) References Cited

U.S. PATENT DOCUMENTS

| | | | |
|---|---|---|---|
| 7,279,363 B2 | 10/2007 | Cherukuri et al. | |
| 8,048,794 B2 | 11/2011 | Knickerbocker | |
| 8,053,814 B2 | 11/2011 | Chen et al. | |
| 8,395,191 B2* | 3/2013 | Or-Bach et al. | 257/213 |
| 2008/0030960 A1 | 2/2008 | Edwards et al. | |
| 2010/0290193 A1 | 11/2010 | Liu et al. | |
| 2011/0215457 A1 | 9/2011 | Park | |
| 2012/0049347 A1 | 3/2012 | Wang | |

OTHER PUBLICATIONS

Luo, et al., Thermal-Scalable 3D Parallel-Heat-Sinking Integration Methodoloy: Key SoC Technology for Large-Scale Parallel Computing, Chinese Journal of Computers, vol. 34 No. 4, Apr. 2011.

* cited by examiner

*Primary Examiner* — Thuan Do
(74) *Attorney, Agent, or Firm* — Wood, Herron & Evans, LLP; Anthony J. Canale

(57) ABSTRACT

Stacked chip systems and design structures for stacked chip systems, as well as methods and computer program products for placing thermal conduction paths in a stacked chip system. The method may include determining an availability of space in a layout of an interconnect structure of a first chip for a fill shape structure extending partially through the interconnect structure to thermally couple a metal feature in the interconnect structure with a bonding layer between the interconnect structure of the first chip and a second chip. If space is available, the fill shape structure may be placed in the layout of the interconnect structure of the first chip. The stacked chip system may include the first and second chips, the bonding layer between the interconnect structure of the first chip and the second chip, and the fill shape structure.

16 Claims, 5 Drawing Sheets

THERMALLY-OPTIMIZED METAL FILL FOR STACKED CHIP SYSTEMS

BACKGROUND

The invention generally relates to semiconductor manufacturing and, more particularly, to stacked chip systems, methods for designing a stacked chip system, computer program products for a stacked chip system, and design structures for a stacked chip system.

Stacked chip systems arrange the constituent chips or dies in a compact single stack characterized by multiple tiers. The functionality of a stacked chip system requires functionality of each individual chip within the stack. The stacked arrangement of the three-dimensional integration conserves space and shortens signal transmission distances for inter-chip communications, which may improve both efficiency and performance of the multiple chip system. During manufacture, chips are processed independently to form integrated circuits and interconnect structures. The chips are subsequently brought into physical contact with each other and bonded so that the chips are vertically aligned with permanent attachment to each other.

Improved stacked chip systems, methods for designing a stacked chip system, computer program products for a stacked chip system, and design structures for a stacked chip system are needed.

BRIEF SUMMARY

In an embodiment of the invention, a method is provided for placing thermal conduction paths in a stacked chip system. The method includes determining, by a computer, an availability of space in a layout of an interconnect structure of a first chip for a fill shape structure extending partially through the interconnect structure to thermally couple a metal feature in the interconnect structure with a bonding layer between the interconnect structure of the first chip and a second chip. The method further includes placing, by the computer, the fill shape structure in the layout of the interconnect structure of the first chip if space is available.

In an embodiment of the invention, a computer program product is provided for placing thermal conduction paths in a stacked chip system. The computer program product comprises a computer readable storage medium having program code embodied therewith. The program code is readable/executable by a computer to determine an availability of space in a layout of an interconnect structure of a first chip for a fill shape structure extending partially through the interconnect structure to thermally couple a metal feature in the interconnect structure with a bonding layer between the interconnect structure of the first chip and the bonding layer. The program code is further readable/executable by a computer to place the fill shape structure in the layout of the interconnect structure of the first chip if space is available.

In an embodiment of the invention, a stacked chip system comprises a first chip comprising an interconnect structure having a metal feature, a second chip, and a bonding layer between the interconnect structure of the first chip and the second chip. The stacked chip system further comprises a fill shape structure extending partially through the interconnect structure to the metal feature. The fill shape structure thermally couples the metal feature in the interconnect structure with the bonding layer.

BRIEF DESCRIPTION OF THE SEVERAL VIEWS OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
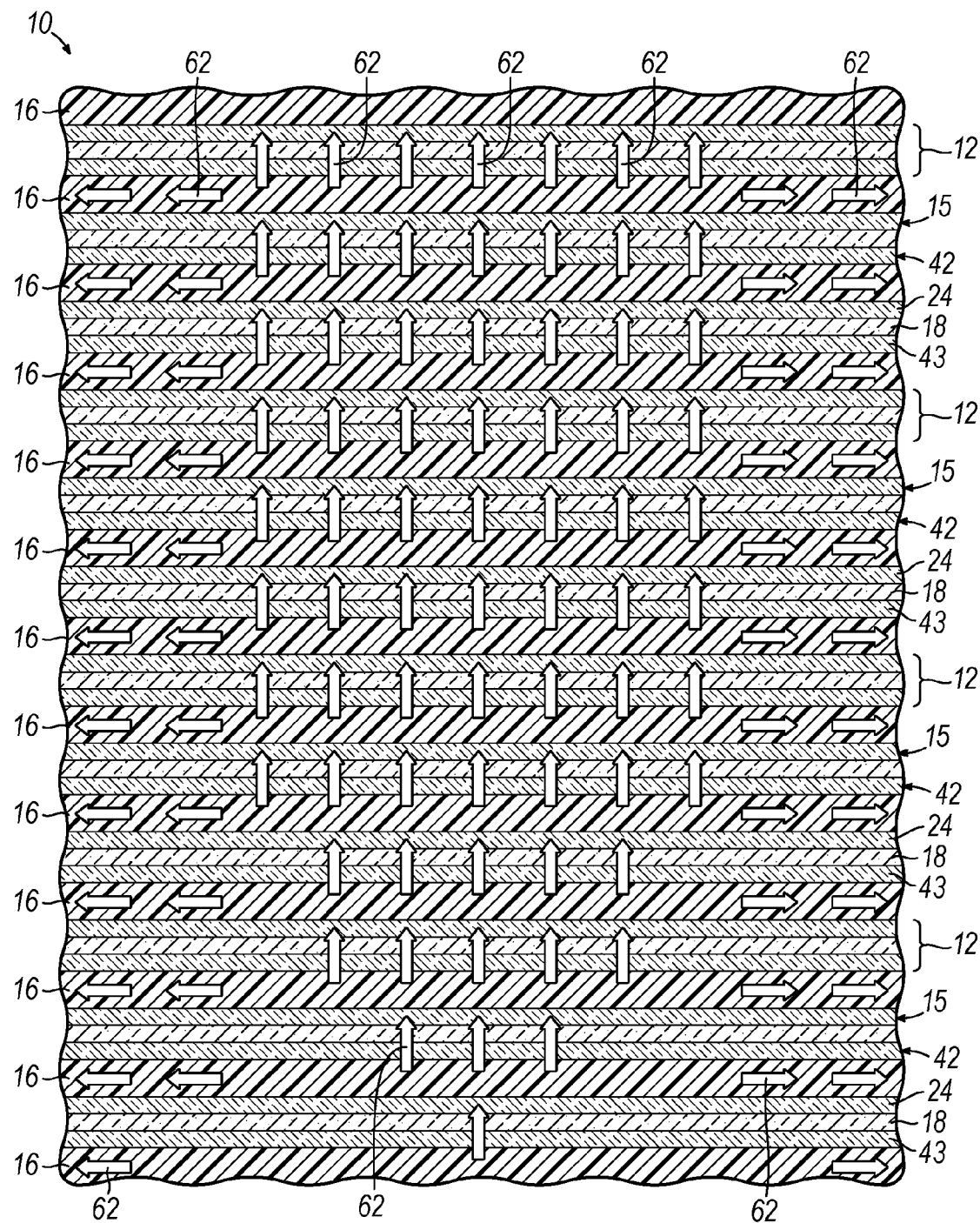
FIG. 1 is a cross-sectional view of a stacked chip system in accordance with an embodiment of the invention.
Figure 2:
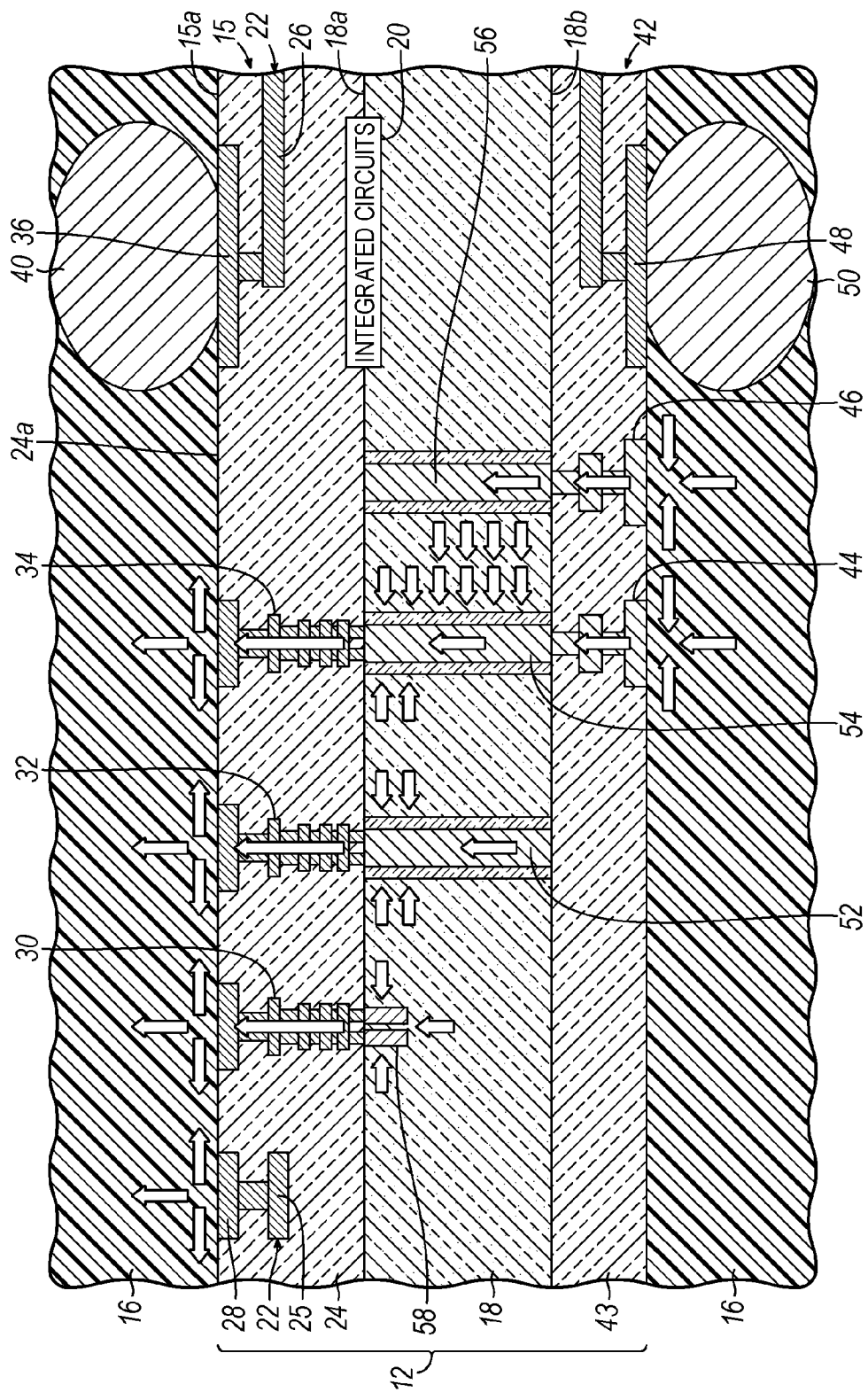
FIG. 2 is an enlarged cross-sectional view of a portion of the stacked chip system of FIG. 1.

With reference to FIGS. 1 and 2 and in accordance with an embodiment of the invention, a stacked chip system 10 includes plurality of die or chips 12 arranged in a vertical stack. Adjacent pairs of the chips 12 are joined in a face-to-face fashion to the adjacent chip 12 by a bonding layer 16. The number of chips 12 in the stacked chip system 10 may be as great as 100 or more chips that are arranged in a single brick.

Each of the chips 12 in the stacked chip system 10 comprises a substrate 18 and integrated circuits 20 fabricated using the substrate 18 by front end of line (FEOL) processes, such as complimentary metal-oxide-semiconductor (CMOS) or bipolar-CMOS (BiCMOS) processes. The substrate 18 may comprise, for example, a bulk substrate of a semiconductor material, such as silicon, which may be lightly doped with an impurity to alter its electrical properties and may also comprise an epitaxial layer. The chips 12 of the stacked chip system 10 may be fabricated with different technology nodes (130 nm, 90 nm, 65 nm, 45 nm, etc.), or may be characterized by a specific circuitry type (RF, analog, photonic, memory, MEMS, digital, etc.). After the integrated circuits 20 are formed, the substrate 18 is thinned through grinding and/or polishing.

Each of the chips 12 in the stacked chip system 10 may also comprise an interconnect structure, generally indicated by reference numeral 15, that is configured to communicate signals to the integrated circuits 20 on each chip and to provide power and ground connections for the integrated circuits 20. The interconnect structure 15 may be fabricated using back-end-of-line (BEOL) processes. The interconnect structure 15 includes at least one wiring layer comprising metal features embedded in a dielectric layer. Typical constructions for the interconnect structure 15 may consist of about two (2) to about fifteen (15) metallization levels. The metallization levels of the interconnect structure 15 may be formed by lithography and etching techniques characteristic of damascene processes associated with BEOL processing.

In particular and as best shown in FIG. 2 for one of the chips 12, a wiring layer 22 of the interconnect structure 15 is embedded in a dielectric layer among a stack of dielectric layers, generally indicated by reference numeral 24. In the representative embodiment, the wiring layer 22 may be considered to form the topmost or last wiring layer of the interconnect structure 15. Alternatively, wiring layer 22 may be one of the upper wiring layers of interconnect structure 15, but not the topmost wiring layer. The wiring layer 22 may include a plurality of metal features 25, 26 that may be used to couple the integrated circuits with external functional objects, such as power and ground lines coupled with a power supply. The metal features 25, 26 may be arranged as adjacent structures in a spaced relationship within a layer. It is understood that additional wiring layers of the interconnect structure 15 are present between wiring layer 22 and the substrate 18 of chip 12.

A plurality of metal features 28, 30, 32, 34, 36 may be formed using a BEOL process in the dielectric layer stack 24. Metal features 28, 30, 32, 34 are dummy fill shape structures that extend from a top surface 15a either partially or completely through the dielectric layer stack 24. Metal feature 28 comprises metal line and via shapes, and extends partially through the dielectric layer stack 24 to connect with the metal feature 25. Metal feature 28, which terminates at metal feature 25, is shorter than metal features 30, 32, 34. Metal features 30, 32, 34 each comprise metal line and via shapes that extend through the full thickness of the dielectric layer stack 24 to reach the top surface 18a of substrate 18.

Metal feature 36 may function as a connection pad for a solder bump 40 and is coupled by a metal-filled via with the metal feature 26 in wiring layer 22. The chip 12 is joined to the adjacent chip (e.g., another chip 12) by the adjacent bonding layer 16 that is coextensive with the top surface 15a of the interconnect structure 15. The solder bump 40 defines an electrical and physical connection with a complementary metal feature (not shown) of the adjacent chip 12.

An interconnect structure 42 may be formed as a backside-metal using BEOL processes on an opposite side of the substrate 18 (i.e., a back side) from interconnect structure 15. The interconnect structure 42 includes metal features 44, 46, 48 in a dielectric layer of a stack of dielectric layers 43. Metal feature 48 functions as a connection pad for a solder bump 50. Metal features 44, 46 are coextensive with the adjacent bonding layer 16.

A deep trench structure 58 may extend partially through the thickness of the substrate 18. The deep trench structure 58 may be fabricated using a deep trench formed by a reactive ion etch (RIE) process, such as a Bosch process. The deep trench structure 58 may comprise a conductor, such as highly-doped polysilicon, and an insulating line of oxide or nitride on the deep trench sidewalls. The deep trench structure 58 is coupled with the metal feature 28, which is in thermal contact with the bonding layer 16.

Through silicon vias (TSVs) 52, 54, 56 extend through the thickness of substrate 18 and permit the chip 12 to have backside metal layers in addition to the front end metal layers. TSV 52 extends vertically from a top surface 18a of the substrate 18 to a bottom surface 18b of the substrate 18, and is coupled with the metal feature 32. TSV 54 extends vertically though the thickness of the substrate 18 and is coupled with the metal feature 34 placed in interconnect structure 15. The metal feature 46 in interconnect structure 42 is coupled by TSV 54 with metal feature 34. TSV 56 extends vertically from the top surface 18a of substrate 18 though the thickness of the substrate 18 and is coupled with the metal feature 46. The coupling is facilitated by vertical registration and alignment between the TSV 52 and metal feature 32, the TSV 54 and metal feature 34, and the TSV 56 and metal feature 36, which have placements determined by a fill algorithm. The TSVs 52, 54, 56 comprise pillars of metal defined by metal lines and metal filled vias within the active area of the chip 12. The TSVs 52, 54, 56 may be located in regions of the active area of chip 12 designated as not having an active device. When the substrate 18 is thinned, the TSVs 52, 54, 56 are exposed on the bottom surface 18b until the interconnect structure 42 is formed.

The metal feature 28 constitutes a dummy fill shape structure that is directly coupled with the existing metal feature 25 in the wiring layer 22. Heat can be transferred by thermal conduction through the metal feature 28 from the metal feature 25 and the surrounding dielectric material to the bonding layer 16, which is in thermal contact with and coextensive with the metal feature 28.

The TSV 52 and metal feature 32, the TSV 56 and metal feature 34, and the deep trench structure 58 and metal feature 30 provide respective independent thermal paths for transferring heat by conduction from the substrate 18 to the bonding layer 16 adjacent to interconnect structure 15. The metal feature 30 constitutes a dummy fill shape structure that is directly coupled with the deep trench structure 58, which extends partially through the thickness of the substrate 18. Heat can be transferred by thermal conduction from the semiconductor material of substrate 18 surrounding the deep trench structure 58 to the deep trench structure 58, vertically from the deep trench structure 58 to the metal feature 30, and vertically through the metal feature 30 to the bonding layer 16, which is in thermal contact with the metal feature 30 over a coextensive interface.

The metal feature 32 constitutes a dummy fill shape structure that is directly coupled with TSV 52. The metal feature 32 extends through all of the wiring layers of the interconnect structure 15 to the top surface 18a of substrate 18, and the TSV 52 extends through the entire thickness of the substrate 18. Heat can be transferred by thermal conduction from the semiconductor material of substrate 18 surrounding the TSV 52 to the TSV 52, vertically from the TSV 52 to the metal feature 32, and vertically through the metal feature 32 to the bonding layer 16, which is in thermal contact with the metal feature 32 over a coextensive interface.

The metal feature 34 constitutes a dummy fill shape structure that is directly coupled with TSV 54. The metal feature 34 extends through all of the wiring layers of the interconnect structure 15 to the top surface 18a of substrate 18, and the TSV 54 extends through the entire thickness of the substrate 18. Heat can be transferred by thermal conduction from the semiconductor material of substrate 18 surrounding the TSV 54 to the TSV 54, vertically from the TSV 54 to the metal feature 34, and vertically through the metal feature 34 to the bonding layer 16, which is in thermal contact with the metal feature 34 over a coextensive interface. The TSV 54 is also in thermal contact with the metal feature 44 in interconnect structure 42, which provides a thermal path from the bonding layer 16 adjacent to interconnect structure 42 to the TSV 54.

The metal feature 46 is configured to transfer heat by conduction from the bonding layer 16 that is coextensive with the interconnect structure 42 to the TSV 56. The TSV 56 terminates at the top surface 18a of substrate 18 and, consequently, does not penetrate through the interconnect structure 15. Heat can be laterally transferred from the TSV 56 to the substrate 18 for vertical removal by, for example, the adjacent TSV 54 and metal feature 34.

The TSVs 52, 54, 56 may be fabricated by deep reactive ion etching or laser drilling deep vias into the material of the substrate 18 used to form the chip 12, electrically insulating the deep vias, lining each via with a conductive liner, and filling each via with a metal (e.g., copper, tungsten), then thinning the substrate 18 from the back side until the via metal is exposed, and depositing a metal film to form the back-side-metal for electrical contact. The electrically insulating liner may be omitted in an embodiment of the invention. It is apparent that, although the TSVs 52, 54, 56 are designated as through "silicon" vias, the paths of the vias reside in other types of material(s). Additional TSVs similar to TSVs 52, 54, 56 may be formed that function as wiring paths for power, ground, or signal input/output communication between the various chips 12.

The solder bumps 40, 50 may be coupled with analogous metal features of an adjacent chip to supply mechanical and electrical connections. The solder bumps 40, 50 may comprise controlled collapse chip connection (C4) solder bumps. A group of metallic layers known as the Ball Limiting Metallurgy (BLM) may be applied to the metal features 38, 48 to promote adhesion, to promote solder wetting, and to act as a solder diffusion barrier. The solder bumps 40, 50 may be comprised of solder having a conventional lead-free (Pb-free) composition, which may include tin (Sn) as the primary elemental component. In a representative embodiment, the solder bumps 40, 50 may be separately formed and transferred to the pads by a controlled collapse chip connection new process (C4NP) technology.

Each bonding layer 16 may be comprised of a material that is an inter-chip material that is thermally conductive and electrically insulating, such as diamond or an adhesive (e.g., an epoxy). The material of the bonding layer 16 may be characterized by an electrical resistivity at room temperature of greater than $10^{10}$ ($\Omega$-m). The material of the bonding layer 16 may be characterized by a thermal conductivity at room temperature greater than the thermal conductivity at room temperature of copper (i.e., 400 W/m·K) or, alternatively, the material of the bonding layer 16 may be characterized by a thermal conductivity at room temperature greater than the thermal conductivity at room temperature of aluminum (i.e., 240 W/m·K). The enhanced thermal conductivity of the material of the bonding layer 16 promotes heat flow laterally and vertically in the stacked chip system 10 to the sides of the chip stack system 10. If the bonding layer 16 is comprised of diamond, then the thermal conductivity at room temperature may be 2200 W/m·K and the electrical resistivity at room temperature may be $10^{18}$ $\Omega$·m.

Each of the dielectric layers in the dielectric layer stacks 24, 43 may comprise any suitable organic dielectric material, inorganic dielectric material, or a combination of these materials. Candidate inorganic dielectric materials may include, but are not limited to, silicon dioxide, fluorine-doped silicon glass (FSG), organosilicate glasses, hydrogen-enriched silicon oxycarbide (SiCOH), and a carbon-doped oxide. Alternatively, the dielectric material of one or more of the dielectric layers may be a porous or nonporous organic dielectric, such as polyimide. The dielectric layers may be applied by, for example, spin-on application or chemical vapor deposition (CVD). The dielectric materials comprise electrically and thermally insulating materials, which may have a thermal conductivity at room temperature of 30 W/m·K or less.

The metal features 25, 26, 28, 30, 32, 34, 36, 44, 46, and 48 may be comprised of copper, aluminum, or an alloy of these materials, and may be formed by a damascene process and/or by subtractive etching. The metal features 28, 30, 32, 34 each have an interface that is coextensive with the bonding layer 16 and which may be coplanar with a top surface 24a of dielectric layer stack 24. The metal features 28, 30, 32, 34, which are in thermal contact with the bonding layer 16, effectively conduct heat generated by the integrated circuits 20 from the powered and operating chip 12 to the material of the bonding layer 16. The thermal contact between the fill shape structures represented by metal features 28, 30, 32, 34 and the bonding layer permit heat to flow as thermal energy directly from metal features 28, 30, 32, 34 to the bonding layer 16. The metal features 28, 30, 32, 34 have a significantly higher thermal conductivity than the materials of the dielectric layer stack 24 and, therefore, are considerably more efficient at heat transfer than the materials of the dielectric layer stack 24.

The thermally-optimized fill shape supplied by the dummy fill shape structure comprising metal feature 28 (and similar metal features distributed across the chip 12) may increase the thermal conductivity between the thermally-conductive inter-chip material (i.e., the bonding layer 16) and the top-most active wiring (i.e., wiring layer 22) in the on-chip BEOL stack by supplying a thermal conduction path. The thermally-optimized fill shapes by the dummy fill shape structure comprising metal features 30, 32, 34 (and similar metal features distributed across the chip 12) may increase the thermal conductivity between the thermally-conductive inter-chip material (i.e., the bonding layer 16) and the substrate 18 by supplying respective thermal conduction paths. The fill pattern defining the metal features 30, 32, 34 comprises connected BEOL metal and via shapes, and the metal features are coupled with either TSV or DT shapes (i.e., TSVs 52, 54 and deep trench structure 58) in the substrate 18. The thermally-optimized fill pattern may be produced by a thermal fill placement algorithm (FIG. 4), which promotes an improvement in thermal conductivity by determining the placement of the fill shape structures.

The arrows 62 in FIG. 1 diagrammatically illustrate the vertical and lateral heat flow in the stacked chip system 10. Vertical heat flow across each interconnect layer 15 is primarily mediated by the thermally-optimized fill shapes, which have a significantly higher thermal conductivity than the dielectric layer stack 24, and lateral heat flow in the stacked chip system 10 is primarily mediated by the bonding layers 16. Heat energy is conducted by the bonding layers to the sides of the stacked chip system 10 and is radiated from the sides of the stacked chip system 10 to the cooler surrounding environment. The heat removal functions to limit the temperature rise of the stacked chip system 10.

Figure 3:
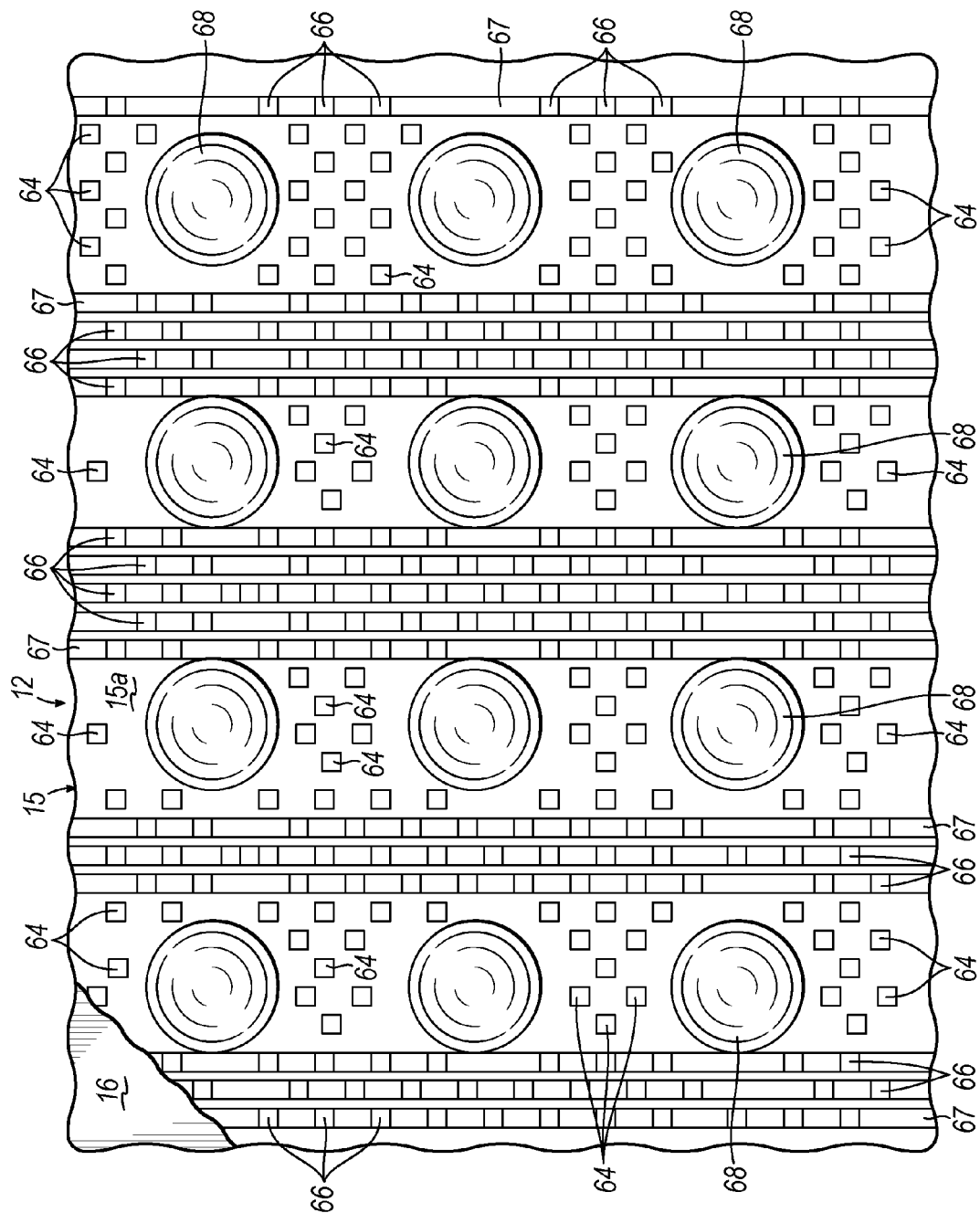
FIG. 3 is a top view of a stacked chip system in accordance with an embodiment of the invention.

With reference to FIG. 3, a plurality of fill shape structures 64 and a plurality of fill shape structures 66 are disposed in the interconnect structure 15 of chip 12. The fill shape structures 66, which constitute thermal conduction paths, may be analogous to the metal feature 28 (FIG. 2) in that the fill shape structures 66 are placed so as to be vertically connected with metal lines 67 in the topmost active wiring layer. The thermal connections afforded by the fill shape structures 66 do not introduce appreciable cross-talk compared to capacitance coupling between long parallel wiring in top-most metal layers. The metal lines 67 may be, for example, power/ground rails. The fill shape structures 64, which constitute independent thermal conduction paths, may be analogous to the fill shape structures defined by the metal features 30, 32, 34 and are coupled with deep trench structures and/or TSVs 52, 54. Solder bumps 68, which are analogous in function and construction to solder bumps 40, 50, are provided to supply physical and electrical inter-chip connections.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 4:
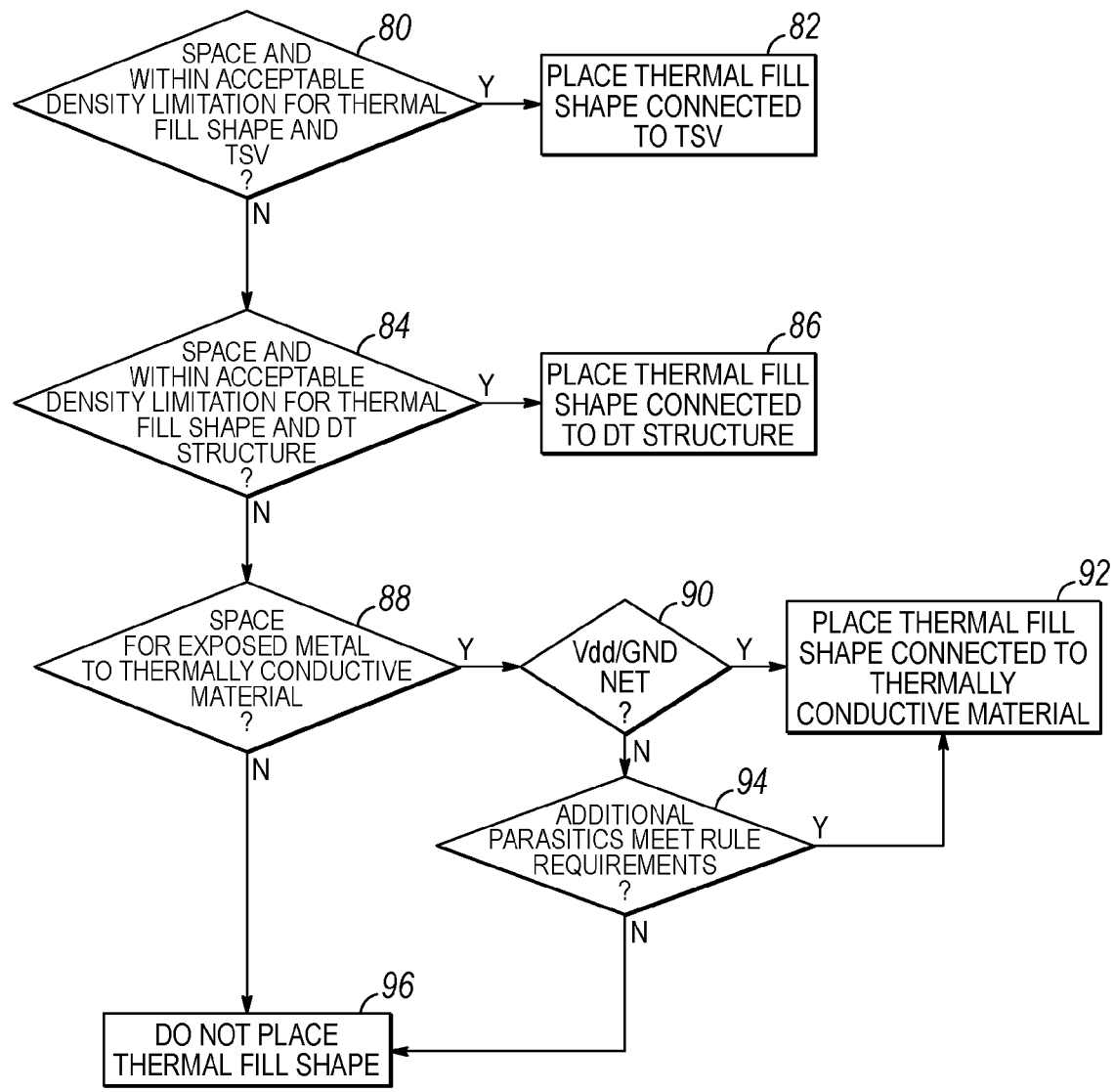
FIG. 4 is a flow diagram of a design process to provide the features providing the thermal optimization.

Referring now to FIG. 4, a procedure or process flow is provided in the form of a fill algorithm for adding the thermally-optimized fill shape structures as thermal conduction paths to a chip in a stacked chip system. The process flow in FIG. 4 is iterated for a plurality of areas in the layouts of the wiring in the interconnect structure and the devices in the integrated circuit.

A determination is made in block 80 whether space is available and whether placement would be within acceptable density limits in the layout of the interconnect structure for a dummy fill shape structure (i.e., a metal feature) and in the layout of the integrated circuit for a TSV that is physically located in the substrate and directly coupled with the dummy fill shape structure. If the determination in block 80 indicates that these conditions are satisfied, a metal feature comprising a fill shape structure is placed (i.e., inserted) in the layout for the interconnect structure and a TSV is placed in the layout for the integrated circuit in block 82. The placed TSV and fill shape structure may be vertically aligned so as to promote the direct coupling. The satisfaction of the conditions is contingent upon, among other conditions, the availability of a vertical path in the wiring levels of the interconnect structure for a metal feature to penetrate to the top surface of the substrate without intersecting another metal feature in one of the wiring layers of the interconnect structure or otherwise violating a rule for proximity to such another metal feature.

If the determination in block 80 indicates that these conditions are not satisfied, a determination is made in block 84 whether space is available and whether placement would be within acceptable density limits in the layout of the interconnect structure for a dummy fill shape structure (i.e., a metal feature) and in the layout of the integrated circuit for a deep trench structure in the substrate that is physically located in the substrate and directly coupled with the dummy fill shape structure. The deep trench structure and fill shape structure may be vertically aligned so as to promote the direct coupling.

If the determination in block 84 indicates that these conditions are satisfied, a metal feature comprising a fill shape structure is placed in the layout for the interconnect structure and a deep trench structure is placed in the layout for the integrated circuit in block 86. The satisfaction of the conditions is contingent upon, among other conditions, the availability of a vertical path in the wiring levels of the interconnect structure for a metal feature to penetrate to the top surface of the substrate without intersecting another metal feature in one of the wiring layers of the interconnect structure or otherwise violating a rule for proximity to such another metal feature.

With regard to blocks 80, 84, density rules control the amount of dummy fill structures to be placed such that the layout density lies between allowed lower and upper bounds. The density limits in the respective determinations may include stand-off spaces to decrease proximity and thereby reduce cross-talk (i.e., delay due to cross-coupling capacitance).

If the determination in block 84 indicates that these conditions are not satisfied, then a determination is made in block 88 whether space is available for a fill shape structure in the form of exposed metal that is coupled to other thermally-conductive material, such as a metal line in the topmost wiring layer or, alternatively, in one of the uppermost wiring layers. If the determination in block 88 indicates that this condition is satisfied and space exists, then a determination is made in block 90 of whether or not the thermally conductive material is a power line or ground line (i.e., part of the Vdd/GND net). If the determination in block 90 indicates that the thermally conductive material is a power line or a ground line (i.e., a power rail or a ground rail), then a fill shape structure is placed in the layout of the interconnect structure in block 92 at a location that is aligned with and thermally coupled to the power line or ground line. In top-most active wiring layers, an added fill shape structure does not introduce appreciable cross-talk compared to the existing capacitance coupling between long parallel wiring to which the added fill shape structure is coupled. Any capacitance added by the fill shape structure is negligible.

If the determination in block 90 indicates that the thermally conductive material is not a power line or ground line, then the thermally conductive material is a signal line. A determination is made in block 94 whether the parasitic capacitance and resistance of the added fill shape structure in the layout of the interconnect structure satisfies rule requirements for parasitics. If the determination in block 94 indicates that the parasitics rule requirements are satisfied, then the process proceeds to block 92 and a fill shape structure is placed in the layout of the interconnect structure that is aligned with and thermally coupled with the signal line. If the determination in either block 88 or block 94 is negative, then a fill shape structure is not placed (block 96).

With the sequence of decisions triggered in the process flow by a positive determination in block 88, the fill algorithm allows the fill shape structures (i.e., the metal features) to be placed for connection to the nearest underlying metal layer, such as the topmost wiring layer of the interconnect structure. This complements allowing placing fill shape structures and TSVs/deep trench structures at locations (i.e., by positive determinations in blocks 80, 84) at which the composite structures can penetrate in a vertical line through the interconnect structure. Thermal paths that are coupled to wiring layers of the interconnect structure (i.e., by a positive determination in block 88) may be favored in very densely wired chips (e.g., digital chips) in which little spare space exists for placement of vertical thermal paths of fill shape structures that penetrate through the full thickness of the interconnect structure. To the contrary, fill shape structures and TSVs/deep trench structures (which provide a comparatively higher degree of heat transfer) may be more easily placed in chips (e.g., analog chips) that are wired less densely in comparison with densely-wired chips (e.g., digital chips).

The process flow of FIG. 4 may occur before standard fill placement during chip design. This allows placement of direct metal connections coupling TSVs and/or deep trench structures at the substrate with thermally conductive interchip material and/or direct metal connections coupling the topmost metal wiring with the thermally conductive interchip material. The determinations may be based upon one or more design rules applied in design rule checking to determine whether the physical layout of a particular chip layout satisfies a series of recommended parameters (i.e., the applicable design rules). The design rules specify certain geometric and connectivity restrictions to ensure sufficient margins to account for variability in semiconductor manufacturing processes. The determinations in FIG. 4 may be computed using an electronic design automation (EDA) tool that is configured to assign exact locations for the direct metal connections, TSVs, and/or deep trench structures within the chip area.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Figure 5:
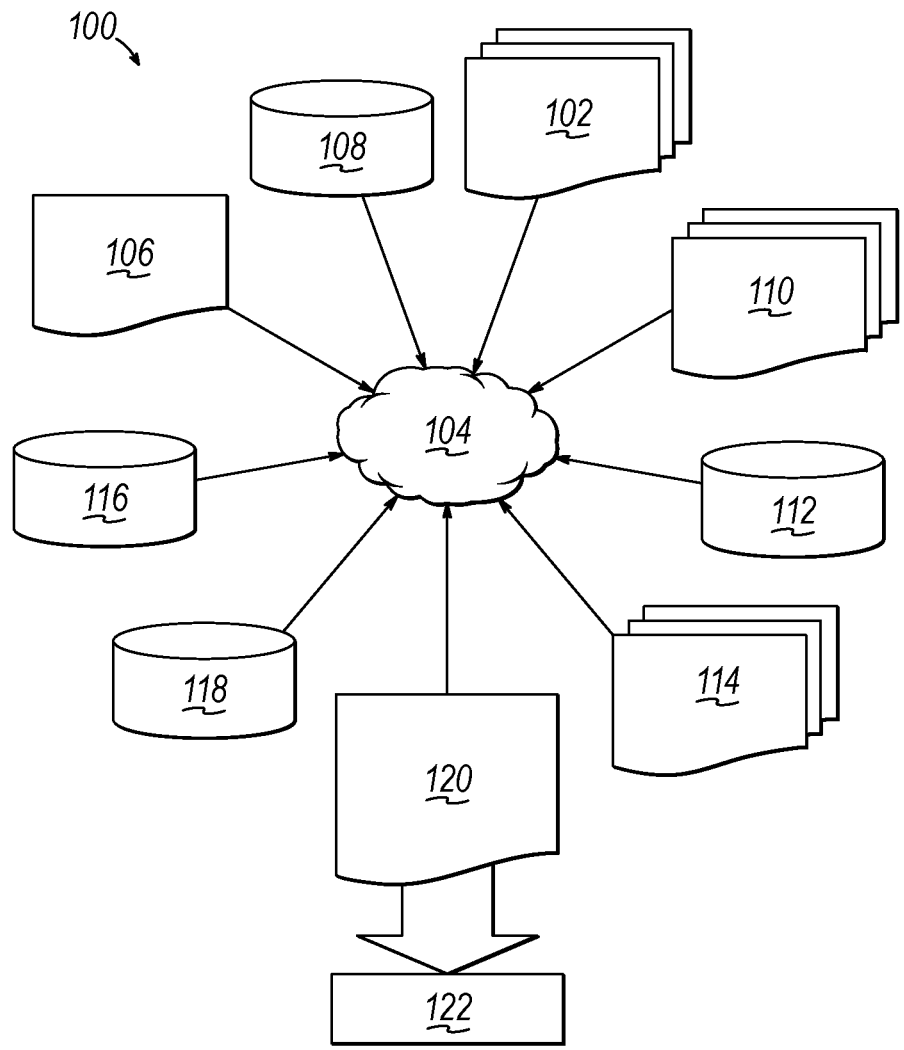
FIG. 5 is a flow diagram of a design process used in semiconductor design, manufacture, and/or test.

FIG. 5 shows a block diagram of an exemplary design flow 100 used for example, in semiconductor IC logic design, simulation, test, layout, and manufacture. Design flow 100 includes processes, machines and/or mechanisms for processing design structures or devices to generate logically or otherwise functionally equivalent representations of the design structures and/or devices described above and shown in FIGS. 1-3. The design structures processed and/or generated by design flow 100 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 100 may vary depending on the type of representation being designed. For example, a design flow 100 for building an application specific IC (ASIC) may differ from a design flow 100 for designing a standard component or from a design flow 100 for instantiating the design into a programmable array, for example a programmable gate array (PGA) or a field programmable gate array (FPGA) offered by Altera® Inc. or Xilinx® Inc.

FIG. 5 illustrates multiple such design structures including an input design structure 102 that is preferably processed by a design process 104. Design structure 102 may be a logical simulation design structure generated and processed by design process 104 to produce a logically equivalent functional representation of a hardware device. Design structure 102 may also or alternatively comprise data and/or program instructions that when processed by design process 104, generate a functional representation of the physical structure of a hardware device. Whether representing functional and/or structural design features, design structure 102 may be generated using electronic computer-aided design (ECAD) such as implemented by a core developer/designer. When encoded on a machine-readable data transmission, gate array, or storage medium, design structure 102 may be accessed and processed by one or more hardware and/or software modules within design process 104 to simulate or otherwise functionally represent an electronic component, circuit, electronic or logic module, apparatus, device, or system such as those shown in FIGS. 1-3. As such, design structure 102 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 104 preferably employs and incorporates hardware and/or software modules for synthesizing, translating, or otherwise processing a design/simulation functional equivalent of the components, circuits, devices, or logic structures shown in FIGS. 1-3 to generate a netlist 106 which may contain design structures such as design structure 102. Netlist 106 may comprise, for example, compiled or otherwise processed data structures representing a list of wires, discrete components, logic gates, control circuits, I/O devices, models, etc. that describes the connections to other elements and circuits in an integrated circuit design. Netlist 106 may be synthesized using an iterative process in which netlist 106 is resynthesized one or more times depending on design specifications and parameters for the device. As with other design structure types described herein, netlist 106 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 104 may include hardware and software modules for processing a variety of input data structure types including netlist 106. Such data structure types may reside, for example, within library elements 108 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 110, characterization data 112, verification data 114, design rules 116, and test data files 118 which may include input test patterns, output test results, and other testing information. Design process 104 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 104 without deviating from the scope and spirit of the invention. Design process 104 may also include modules for performing standard circuit design processes such as timing analysis, verification, design rule checking, place and route operations, etc.

Design process 104 employs and incorporates logic and physical design tools such as HDL compilers and simulation model build tools to process design structure 102 together with some or all of the depicted supporting data structures along with any additional mechanical design or data (if applicable), to generate a second design structure 120. Design structure 120 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 102, design structure 120 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-3. In one embodiment, design structure 120 may comprise a compiled, executable HDL simulation model that functionally simulates the devices shown in FIGS. 1-3.

Design structure 120 may also employ a data format used for the exchange of layout data of integrated circuits and/or symbolic data format (e.g. information stored in a GDSII (GDS2), GL1, OASIS, map files, or any other suitable format for storing such design data structures). Design structure 120 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-3. Design structure 120 may then proceed to a stage 122 where, for example, design structure 120: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It will be understood that when an element is described as being "connected" or "coupled" to or with another element, it can be directly connected or coupled to the other element or, instead, one or more intervening elements may be present. In contrast, when an element is described as being "directly connected" or "directly coupled" to another element, there are no intervening elements present. When an element is described as being "indirectly connected" or "indirectly coupled" to another element, there is at least one intervening element present.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of placing thermal conduction paths in a stacked chip system including a first chip having an interconnect structure and a top surface on which the interconnect structure is located, a second chip, and a bonding layer between the interconnect structure of the first chip and the second chip, the method comprising:
    determining, by a computer, an availability of space in a layout of the interconnect structure of the first chip to place a first fill shape structure extending partially through the interconnect structure to thermally couple a metal feature in the interconnect structure with the bonding layer and a second fill shape structure extending completely through the interconnect structure from the bonding layer to the top surface of the substrate;
    determining, by the computer, if the insertion of the first fill shape structure and the second fill shape structure in thermal contact with the metal feature satisfies rule requirements for parasitic capacitance and resistance; and
    placing, by the computer, the first fill shape structure and the second fill shape structure in the layout of the interconnect structure of the first chip if space is available,
    wherein the first fill shape structure and the second fill shape structure are placed only if the rule requirements are satisfied.

2. The method of claim 1 further comprising:
    determining, by the computer, an availability of space in a device layout of an integrated circuit of the first chip to place a through silicon via extending completely through the substrate of the first chip and thermally coupled with the second fill shape structure; and
    placing, by the computer, the through silicon via in the device layout of the integrated circuit of the first chip if space is available.

3. The method of claim 1 further comprising:
    determining, by the computer, an availability of space in a device layout of an integrated circuit of the first chip to place a deep trench structure extending partially through the substrate of the first chip and thermally coupled with the second fill shape structure; and
    placing, by the computer, the deep trench structure in the device layout of the integrated circuit of the first chip if space is available.

4. The method of claim 1 wherein the availability of space for the second fill shape structure in the layout of the interconnect structure of the first chip is determined before the availability of space for the first fill shape structure in the layout of the interconnect structure of the first chip.

5. The method of claim 1 wherein determining, by the computer, the availability of space in the layout of the interconnect structure of the first chip comprises:
    determining, by the computer, whether insertion of the first fill shape structure and the second fill shape structure in the layout of the interconnect structure of the first chip satisfies one or more design rules.

6. A computer program product for placing thermal conduction paths in a stacked chip system including a first chip having an interconnect structure and a top surface on which the interconnect structure is located, a second chip, and a bonding layer between the interconnect structure of the first chip and the second chip, the computer program product comprising a computer readable storage medium having program code embodied therewith, the program code readable/executable by a computer to:
    determine an availability of space in a layout of the interconnect structure of the first chip to place a first fill shape structure extending partially through the interconnect structure to thermally couple a metal feature in the interconnect structure with the bonding layer and a second fill shape structure extending completely through the interconnect structure from the bonding layer to the top surface of the substrate;
    determine if the insertion of the first fill shape structure and the second fill shape structure in thermal contact with the metal feature satisfies rule requirements for parasitic capacitance and resistance; and
    place the first fill shape structure and the second fill shape structure in the layout of the interconnect structure of the first chip if space is available,
    wherein the first fill shape structure and the second fill shape structure are placed only if the rule requirements are satisfied.

7. The computer program product of claim 6 wherein the program code is readable/executable by the computer to:
    determine an availability of space in a device layout of an integrated circuit of the first chip to place a through silicon via extending completely through the substrate of the first chip and thermally coupled with the second fill shape structure; and
    place the through silicon via in the device layout of the integrated circuit of the first chip if space is available.

8. The computer program product of claim 6 herein the program code is readable/executable by the computer to:
    determine an availability of space in a device layout of an integrated circuit of the first chip to place a deep trench structure extending partially through the substrate of the first chip and thermally coupled with the second fill shape structure; and
    place the deep trench structure in the device layout of the integrated circuit of the first chip if space is available.

9. The computer program product of claim 6 wherein the availability of space for the second fill shape structure in the layout of the interconnect structure of the first chip is determined before the availability of space for the first fill shape structure in the layout of the interconnect structure of the first chip.

10. The computer program product of claim 6 wherein the program code is readable/executable to determine the availability of space in the layout of the interconnect structure of the first chip comprises program code readable/executable to:

determine whether insertion of the first fill shape structure and the second fill shape structure in the layout of the interconnect structure of the first chip satisfies one or more design rules.

11. A stacked chip system comprising:
a first chip comprising an interconnect structure having a metal feature and a substrate with a top surface on which the interconnect structure is located;
a second chip;
a bonding layer between the interconnect structure of the first chip and the second chip;
a first fill shape structure extending partially through the interconnect structure to the metal feature, the first fill shape structure thermally coupling the metal feature in the interconnect structure with the bonding layer; and
a second fill shape structure extending completely through the interconnect structure from the bonding layer to the top surface of the substrate,
wherein the first fill shape structure and the second fill shape structure satisfy rule requirements for parasitic capacitance and resistance.

12. The stacked chip system of claim 11 wherein the interconnect structure includes a topmost wiring layer, and the metal feature is in the topmost wiring layer.

13. The stacked chip system of claim 11 wherein the bonding layer is comprised of a material having an electrical resistivity at room temperature of greater than $10^{10}$ ($\Omega$-m) and a thermal conductivity at room temperature greater than 240 W/m·K.

14. The stacked chip system of claim 11 wherein the first fill shape structure is vertically aligned with the metal feature in the interconnect structure and directly coupled with the metal feature.

15. The stacked chip system of claim 11 wherein the first chip further comprises a substrate and a through silicon via extending completely through the substrate, the interconnect structure is positioned vertically between the substrate of the first chip and the bonding layer, and the second fill shape structure is vertically aligned with the through silicon via and thermally couples the through silicon via with the bonding layer.

16. The stacked chip system of claim 11 wherein the first chip further comprises a substrate and a deep trench structure extending partially through the substrate of the first chip, the interconnect structure is positioned vertically between the substrate and the bonding layer, and the second fill shape structure is vertically aligned with the deep trench structure and thermally couples the deep trench structure with the bonding layer.

* * * * *